United States Patent
Ypma et al.

(10) Patent No.: US 11,714,357 B2
(45) Date of Patent: Aug. 1, 2023

(54) METHOD TO PREDICT YIELD OF A DEVICE MANUFACTURING PROCESS

(71) Applicant: ASML NETHERLANDS B.V., Veldhoven (NL)

(72) Inventors: Alexander Ypma, Veldhoven (NL); Cyrus Emil Tabery, San Jose, CA (US); Simon Hendrik Celine Van Gorp, Oud-Turnhout (BE); Chenxi Lin, Newark, CA (US); Dag Sonntag, Eindhoven (NL); Hakki Ergün Cekli, Singapore (SG); Ruben Alvarez Sanchez, Veldhoven (NL); Shih-Chin Liu, Eindhoven (NL); Simon Philip Spencer Hastings, San Jose, CA (US); Boris Menchtchikov, Redwood City, CA (US); Christiaan Theodoor De Ruiter, Eindhoven (NL); Peter Ten Berge, Eindhoven (NL); Michael James Lercel, Fishkill, NY (US); Wei Duan, Eindhoven (NL); Pierre-Yves Jerome Yvan Guittet, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 143 days.

(21) Appl. No.: 17/363,057

(22) Filed: Jun. 30, 2021

(65) Prior Publication Data

US 2021/0325788 A1    Oct. 21, 2021

Related U.S. Application Data

(63) Continuation of application No. 16/497,826, filed as application No. PCT/EP2018/058096 on Mar. 29, 2018, now Pat. No. 11,086,229.

(Continued)

(51) Int. Cl.
    G03F 7/20    (2006.01)
    G03F 7/00    (2006.01)

(52) U.S. Cl.
    CPC .......... G03F 7/70491 (2013.01); G03F 7/705 (2013.01); G03F 7/70658 (2013.01)

(58) Field of Classification Search
    CPC .. G03F 7/70491; G03F 7/705; G03F 7/70658; G03F 7/7065
    See application file for complete search history.

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

| EP | 1696271 | 8/2006 |
| EP | 3309617 | 4/2018 |

(Continued)

OTHER PUBLICATIONS

Korean Office Action issued in corresponding Korean Patent Application No. 10-2021-7027369, dated Nov. 24, 2021.

(Continued)

*Primary Examiner* — Peter B Kim
(74) *Attorney, Agent, or Firm* — Pillsbury Winthrop Shaw Pittman, LLP

(57) ABSTRACT

A method and associated computer program for predicting an electrical characteristic of a substrate subject to a process. The method includes determining a sensitivity of the electrical characteristic to a process characteristic, based on analysis of electrical metrology data including electrical characteristic measurements from previously processed substrates and of process metrology data including measurements of at least one parameter related to the process (Continued)

characteristic measured from the previously processed substrates; obtaining process metrology data related to the substrate describing the at least one parameter; and predicting the electrical characteristic of the substrate based on the sensitivity and the process metrology data.

20 Claims, 5 Drawing Sheets

Related U.S. Application Data

(60) Provisional application No. 62/645,345, filed on Mar. 20, 2018, provisional application No. 62/502,281, filed on May 5, 2017.

(56) References Cited

U.S. PATENT DOCUMENTS

| | | | |
|---|---|---|---|
| 5,523,193 | A | 6/1996 | Nelson |
| 5,866,437 | A | 2/1999 | Chen |
| 6,028,994 | A | 2/2000 | Peng et al. |
| 6,622,059 | B1 | 9/2003 | Toprac et al. |
| 6,952,253 | B2 | 10/2005 | Lof et al. |
| 9,977,856 | B2 | 5/2018 | Robles |
| 2001/0017878 | A1 | 8/2001 | Nozoe et al. |
| 2004/0040001 | A1 | 2/2004 | Miller et al. |
| 2005/0128464 | A1 | 6/2005 | Paxton et al. |
| 2006/0016561 | A1 | 1/2006 | Choi et al. |
| 2006/0192936 | A1 | 8/2006 | Schenau et al. |
| 2007/0085991 | A1 | 4/2007 | Liegl et al. |
| 2008/0148194 | A1 | 6/2008 | Chan |
| 2008/0319568 | A1 | 12/2008 | Berndlmaier et al. |
| 2010/0095253 | A1 | 4/2010 | Hou et al. |
| 2010/0214550 | A1 | 8/2010 | Hulsebos et al. |
| 2012/0008127 | A1 | 1/2012 | Tel et al. |
| 2015/0057788 | A1 | 2/2015 | Cantwell et al. |
| 2016/0313651 | A1 | 10/2016 | Middlebrooks et al. |
| 2016/0322267 | A1 | 11/2016 | Kim et al. |
| 2018/0358271 | A1 | 12/2018 | David |
| 2019/0086200 | A1* | 3/2019 | Amit ............... G06N 99/00 |

FOREIGN PATENT DOCUMENTS

| | | |
|---|---|---|
| EP | 3312672 | 4/2018 |
| EP | 3312693 | 4/2018 |
| KR | 2003-0028735 | 4/2003 |
| KR | 2006-0094892 | 8/2006 |
| KR | 10-2016-0047511 | 5/2016 |
| TW | 201530333 | 8/2015 |
| WO | 99-49504 | 9/1999 |
| WO | 01-80306 | 10/2001 |
| WO | 2011081645 | 7/2011 |
| WO | 2013092106 | 6/2013 |
| WO | 2015049087 | 4/2015 |
| WO | 2015090774 | 6/2015 |
| WO | 2015101458 | 7/2015 |
| WO | 2015110191 | 7/2015 |
| WO | 2017060080 | 4/2017 |
| WO | 2017067748 | 4/2017 |
| WO | 2017140532 | 8/2017 |
| WO | 2017144343 | 8/2017 |
| WO | 2017144379 | 8/2017 |
| WO | 2018077651 | 5/2018 |

OTHER PUBLICATIONS

Taiwanese Office Action issued in corresponding Taiwanese Patent Application No. 108148336, dated Mar. 22, 2022.
International Search Report and Written Opinion issued in corresponding PCT Patent Application No. PCT/EP2018/058096, dated Jul. 23, 2017.
Taiwanese Office Action issued in corresponding Taiwanese Patent Application No. 107114374, dated May 27, 2019.
Chinese Office Action issued in corresponding Chinese Patent Application No. 2018800296098, dated Mar. 12, 2021.
Korean Office Action issued in corresponding Korean Patent Application No. 10-2019-7033726, dated Jan. 11, 2021.

* cited by examiner

METHOD TO PREDICT YIELD OF A DEVICE MANUFACTURING PROCESS

This application is a continuation of U.S. patent application Ser. No. 16/497,826, filed Sep. 26, 2019, which is the U.S. national phase entry of PCT patent application no. PCT/EP2018/058096, filed on Mar. 29, 2018, which claims the benefit of priority of U.S. patent application No. 62/502,281, which was filed on May 5, 2017, and of U.S. patent application No. 62/645,345, which was filed on Mar. 20, 2018, each of the foregoing applications is incorporated herein in its entirety by reference.

FIELD

The present description relates to device (e.g., semiconductor) manufacturing processes, in particular a method to predict an electrical characteristic and yield of substrates subject to the process.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate, a lithographic apparatus may use electromagnetic radiation. The wavelength of this radiation determines the minimum size of features which can be formed on the substrate. Typical wavelengths currently in use are about 365 nm (i-line), about 248 nm, about 193 nm and about 13.5 nm. A lithographic apparatus, which uses extreme ultraviolet (EUV) radiation, having a wavelength within the range of about 4-20 nm, for example about 6.7 nm or about 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC) in the design layout, or other methods generally defined as "resolution enhancement techniques" (RET). Alternatively, tight control loops for controlling a stability of the lithographic apparatus may be used to improve reproduction of the pattern at low k1.

These tight control loops are generally based on metrology data obtained using a metrology tool measuring one or more characteristics of the applied pattern or of metrology targets representing the applied pattern. In general the metrology tool is based on optical measurement of the position and/or dimensions of the pattern and/or targets. It is intrinsically assumed that these optical measurements are representative for a quality of the process of manufacturing of the devices.

In addition or alternatively to control based on optical measurements, e-beam based measurements may be performed; among which a so-called low voltage measurement using an e-beam tool (as offered by HMI) may be utilized. Such a low voltage contrast measurement can be indicative of the quality of electrical contact between layers applied to the substrate.

SUMMARY

Typically after all process steps have been completed each die on the substrate should be suitable to yield a functional device (e.g., an IC). In principle before further packaging of an electric device (e.g., an electrical device, an electronic, etc.) is pursued each die is subject to electrical testing using various techniques, such as electrical probing. Electrical probing is normally done at multiple locations across the die, measuring multiple electrical properties (for example voltage, resistance, frequency, etc., wherein each parameter is referred to as a specific bin code). The values of the bin codes are a good indicator of the quality of the electric device; for example when a measured resistance is very high this may indicate that electrical contact between components is not achieved and hence chances are very low that the electric device will be functional. If testing of the electrical properties of a plurality of substrates conveys a large number of non-functional electric devices it may be assumed that the manufacturing process has a low yield.

A disadvantage of the testing at the final stage of device production is that only after execution of all process steps it can be determined whether the yield of the process regarding delivering a minimum desired ratio of functional devices to non-functional devices meets a certain criteria.

Further it is difficult to determine at what locations the electrical probe tests should be performed; as probe testing is quite time-consuming there is a drive to limit the amount of measurements, while maintaining sufficient detectability of non-yielding devices.

Further, control actions of the device manufacturing process are typically based on metrology data. It is unclear whether this is the correct strategy in order to configure the process so as to optimize the yield of functional devices.

It is an object to address one or more of the present or future disadvantages of the state of the art.

In an aspect, there is provided a method for predicting an electrical characteristic of a substrate subject to a process, the method comprising: determining a sensitivity of the electrical characteristic to a process characteristic, based on analysis of electrical metrology data comprising measured electrical characteristics from previously processed substrates and process metrology data comprising measurements of at least one parameter related to the process characteristic measured from the previously processed substrates; obtaining process metrology data related to the substrate describing the at least one parameter; and predicting the electrical characteristic of the substrate based on the sensitivity and the process metrology data.

By relating a process characteristic to the electrical characteristic, knowledge of a process characteristic associated with a substrate being subject to the process may be used to predict the electrical characteristic associated with the substrate. As process characteristic data typically is available throughout the process on a per substrate basis (alignment, leveling data, focus data, etc.) and on a per layer basis, a per substrate and/or per layer prediction of the electrical characteristic can be made. This reveals important yield related information which is available well before the end product (e.g., ICs) is available for electrical testing.

BRIEF DESCRIPTION OF THE DRAWINGS

Embodiments will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. More information on such mirror arrays is given in U.S. Pat. Nos. 5,296,891 and 5,523,193, which are incorporated herein by reference.

a programmable LCD array. An example of such a construction is given in U.S. Pat. No. 5,229,872, which is incorporated herein by reference.

Figure 1:
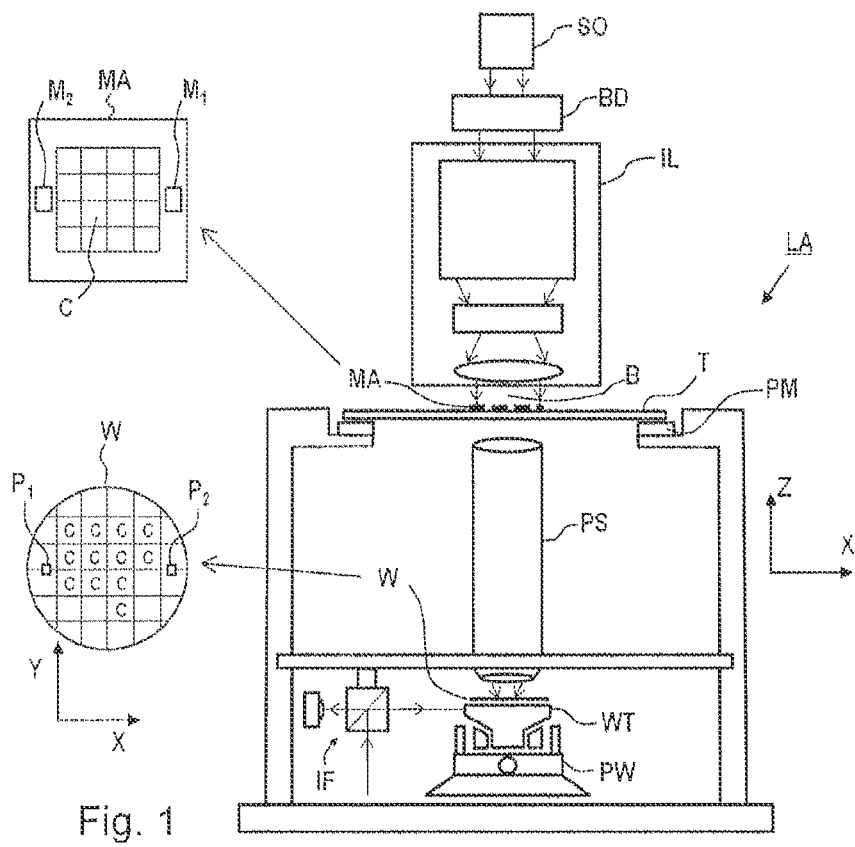
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support structure (e.g., a mask table) MT constructed to support a patterning device (e.g., a mask) MA and connected to a first positioner PM configured to accurately position the patterning device MA in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illuminator IL receives a radiation beam from a radiation source SO, e.g. via a beam delivery system BD. The illumination system IL may include various types of optical components, such as refractive, reflective, magnetic, electromagnetic, electrostatic, or other types of optical components, or any combination thereof, for directing, shaping, or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate may be covered by a liquid having a relatively high refractive index, e.g., water, so as to fill a space between the projection system and the substrate—which is also referred to as immersion lithography. More information on immersion techniques is given in U.S. Pat. No. 6,952,253 and in PCT Patent Application Publication No. WO 99-49504, which are incorporated herein in their entireties by reference.

The lithographic apparatus LA may also be of a type having two (dual stage) or more substrate tables WT and, for example, two or more support structures MT (not shown). In such "multiple stage" machines the additional tables/structures may be used in parallel, or preparatory steps may be carried out on one or more tables while one or more other tables are being used for exposing the design layout of the patterning device MA onto the substrate W.

In operation, the radiation beam B is incident on the patterning device (e.g., mask MA), which is held on the support structure (e.g., mask table MT), and is patterned by the patterning device MA. Having traversed the patterning device MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and possibly another position sensor (which is not explicitly depicted in FIG. 1) may be used to accurately position the patterning device MA with respect to the path of the radiation beam B. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks).

Figure 2:
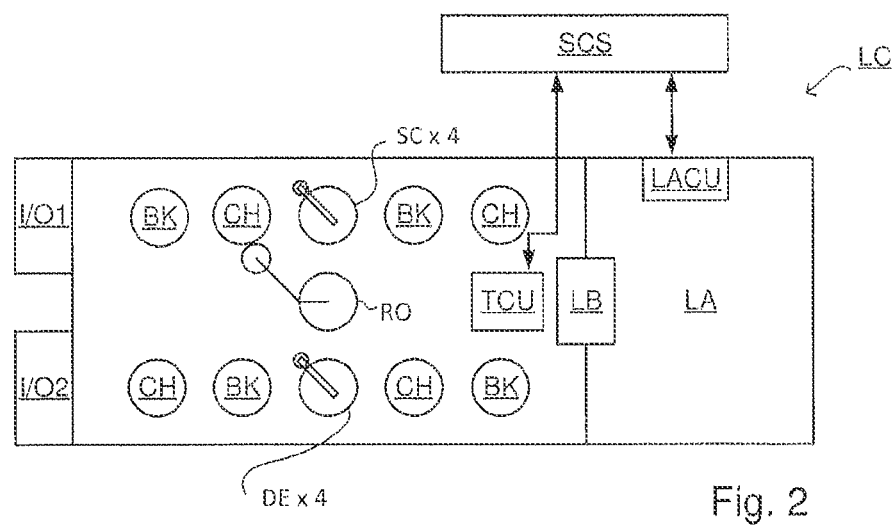
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include one or more spin coaters SC to deposit resist layers, one or more developers DE to develop exposed resist, one or more chill plates CH and/or one or more bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatuses and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine one or more properties of the substrates W, and in particular, how one or more properties of different substrates W vary or how one or more properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the one or more properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
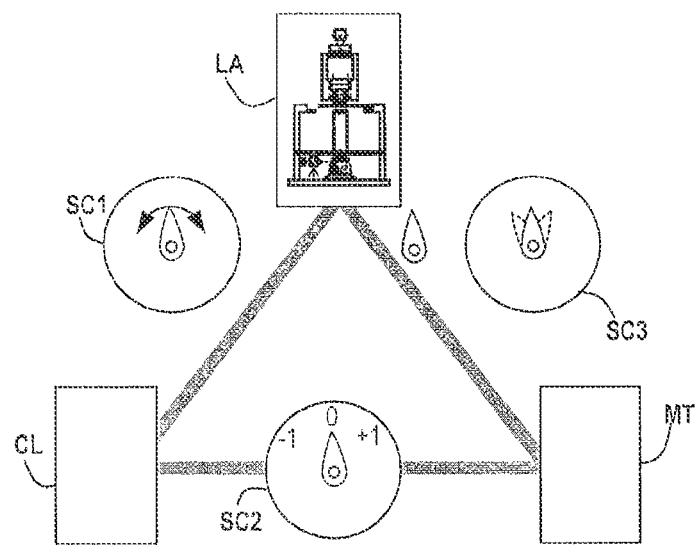
FIG. 3 depicts a schematic representation of holistic lithography, representing cooperation between three key technologies to optimize device manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to help ensure that the patterning performed by the lithographic apparatus LA stays within a process window. The process window defines a range of process parameters (e.g. dose, focus, overlay, etc.) within which a specific manufacturing process yields a defined result (e.g. a functional semiconductor device)—typically within which the process parameters in the lithographic process or patterning process are allowed to vary.

The computer system CL may, e.g., use (part of) the design layout to be patterned to predict which resolution enhancement techniques to use and to perform computational lithography simulations and calculations to determine which patterning device layout and lithographic apparatus settings achieve the largest overall process window of the patterning process (depicted in FIG. 3 by the double white arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) so as to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

The lithographic apparatus LA is configured to accurately reproduce the pattern onto the substrate. The positions and dimensions of the applied features need to be within certain tolerances. Position errors may occur due to an overlay error (often referred to as "overlay"). The overlay is the error in placing a first feature during a first exposure relative to a second feature during a second exposure. The lithographic apparatus minimizes the overlay errors by aligning each substrate accurately to a reference prior to patterning. This is done by measuring positions of alignment marks on the substrate using an alignment sensor. More information on the alignment procedure can be found in U.S. Patent Application Publication No. US 2010-0214550, which is incorporated herein in its entirety by reference. Pattern dimensioning (e.g., CD) errors may, for example, occur when the substrate is not positioned correctly with respect to a focal plane of the lithographic apparatus. These focal position errors may be associated with un-flatness of a substrate surface. The lithographic apparatus aims to minimize these focal positon errors by measuring the substrate surface topography prior to patterning using a level sensor. Substrate height corrections are applied during subsequent patterning to help assure correct imaging (focusing) of the patterning device onto the substrate. More information on the level sensor system can be found in U.S. Patent Application Publication No. US 2007-0085991, which is incorporated herein in its entirety by reference.

Besides the lithographic apparatus LA and the metrology apparatus MT, one or more other processing apparatuses may be used during device production as well. An etching station (not shown) processes the substrates after exposure of the pattern into the resist. The etch station transfers the pattern from the resist into one or more layers underlying the resist layer. Typically etching is based on application of a plasma medium. One or more local etching characteristics may e.g. be controlled using temperature control of the substrate or directing the plasma medium using a voltage controlled ring. More information on etching control can be found in PCT Patent Application Publication No. WO 2011-081645 and U.S. Patent Application Publication No. US 2006-016561, which are incorporated herein in their entireties by reference.

During the manufacturing of devices, it is desired that the process conditions for processing substrates using one or more processing apparatuses such as the lithographic apparatus or etching station remain stable such that properties of the features remain within certain control limits. Stability of the process is of particular significance for features of the functional parts of an electric device such as an IC, also referred to as product features. To help ensure stable processing, process control capabilities should to be in place. Process control involves monitoring of processing data and implementation of means for process correction, e.g. control a processing apparatus based on one or more characteristics of the processing data. Process control may be based on periodic measurement by the metrology apparatus MT, often referred to as "Advanced Process Control" (further also referenced to as APC). More information on APC can be found in U.S. Patent Application Publication No. US 2012-008127, which is incorporated herein in its entirety by reference. A typical APC implementation involves periodic measurements on metrology features on the substrates to monitor and correct drifts associated with one or more processing apparatuses. The metrology features reflect the response to process variations of the product features. The sensitivity of the metrology features to process variations may be different compared to the sensitivity to the product features. In that case, a so-called "Metrology To Device" offset (also referenced to as MTD) may be determined. To mimic the behavior of product features the metrology targets may incorporate segmented features, assist features or features with a particular geometry and/or dimension. A carefully designed metrology target should respond in a similar fashion to process variations as do the product features. More information on metrology target design can be found in PCT Patent Application Publication No. WO 2015-101458 which is incorporated herein in its entirety by reference.

The distribution of locations across the substrate and/or patterning device where metrology targets are present and/or measured is often referred to as a "sampling scheme". Typically the sampling scheme is selected based on an expected fingerprint of the relevant process parameter(s); areas on the substrate where a process parameter is expected to fluctuate are typically sampled more densely than areas where the process parameter is expected to be relatively stable. However, there is a practical limit to the number of metrology measurements which can be performed, based on the allowable impact of the metrology measurements on the throughput of the device manufacturing process. A carefully selected sampling scheme is important to accurately control the device manufacturing process without affecting throughput (or at least affecting it too much) and/or assigning a too large area on the patterning device or substrate to metrology features. Technology related to optimal positioning and/or measuring metrology targets is often referred to as "scheme optimization". More information on scheme optimization can be found in PCT Patent Application Publication No. WO 2015-110191 and European Patent Application No. EP16193903.8, which are incorporated herein in their entireties by reference.

The term fingerprint may refer to a main (systematic) contributor ("latent factor") of a measured signal, and in particular a contributor connected to the performance impact on-substrate or to previous processing steps. Such a fingerprint can refer to a substrate (grid) pattern (e.g. from alignment, leveling, overlay, focus, CD), a field pattern (e.g., from intrafield alignment, leveling, overlay, focus, CD), a substrate zone pattern (e.g., an outermost radius of substrate measurements) or even a pattern in lithographic apparatus measurements related to substrate exposure (e.g., heating signature through-lot from patterning device alignment measurements, temperature/pressure/servo profiles, etc.). Fingerprints may be comprised within a fingerprint collection, and may be encoded homogenously or heterogeneously therein.

In addition to metrology measurement data, context data may be used for process control. Context data may comprise data relating to one or more selected from: one or more selected processing tools (out of the pool of processing apparatuses), one or more specific characteristics of the processing apparatus, one or more settings of a processing apparatus, the design of the device pattern, and/or measurement data relating to one or more processing conditions (for example substrate geometry). Examples of using context data for process control purposes may be found in PCT Patent Application Publication Nos. WO 2017-140532 and WO 2017-060080, which are incorporated herein in their entireties by reference. Context data may be used to control or predict processing in a feed-forward manner, where the context data relates to process steps performed before the currently controlled process step. Often context data is statistically correlated to product feature properties. This enables context driven control of a processing apparatus in view of achieving optimal or improved product feature properties. Context data and metrology data may also be combined e.g. to enrich sparse metrology data to an extent that more detailed (dense) data becomes available which is more useful for control and/or diagnostic purposes. More information on combining context data and metrology data can be found in PCT Patent Application Publication No. WO 2017-144379 which is incorporated herein in its entirety by reference.

As mentioned, monitoring the process is based on acquisition of data related to the process. The required data sampling rate (per lot or per substrate) and sampling density depend on the required level of accuracy of pattern reproduction. For low-k1 processes even small substrate-to-substrate process variations may be significant. The context data and/or metrology data should then be sufficient to enable process control on a per-substrate basis. Additionally when a process variation gives rise to variations of a characteristic across the substrate, the density of the context and/or metrology data should be sufficiently distributed across the substrate. However the time available for metrology (measurements) is limited in view of the desired throughput of the process. As a result of this limitation, the metrology tool may measure only on selected substrates and/or selected locations across the substrate. The strategies to determine which substrates need to be measured are further described in the European Patent Application Nos. EP16195047.2 and EP16195049.8, which are incorporated herein in their entireties by reference.

In practice it is often necessary to derive a denser map of values from a sparse set of measurement values relating to a process parameter (across a substrate or plurality of substrates). Typically such a dense map of measurement values may be derived from the sparse measurement data in conjunction with a model associated with an expected fingerprint of the process parameter. More information on modeling measurement data can be found in PCT Patent Application Publication No. WO 2013-092106 which is incorporated herein in its entirety by reference. As a device manufacturing processes typically involve multiple processing apparatuses (e.g., a lithographic apparatus, one or more etching stations, etc.), it may be beneficial to optimize the process as a whole, e.g. take specific correction capabilities associated with individual processing apparatuses into account. This leads to the perspective that control of a first processing apparatus may be (partly) based on known control properties of a second processing apparatus. This strategy is commonly referred to as co-optimization. Examples of such a strategy include joint optimization of a lithographic apparatus and a density profile of a patterning device and a lithographic apparatus and an etching station. More information on co-optimization may be found in PCT Patent Application Publication Nos. WO 2017-067748 and WO 2017-144343, which are incorporated herein in their entireties by reference.

In some process control situations, the control objective may be, for example, "number of dies in spec". This describes a yield driven process control parameter which aims to obtain a maximum number of functional products per batch of processed substrates. Typically a product is associated with a die on a substrate and, as such, yield based process control is referred to as based on a "dies-in-spec" criterion. This aims to maximize the number of dies within specification, rather than applying an averaged optimization across the substrate (e.g., a least-squares optimization based on a least squares minimization of focus difference from best focus across the substrate). As such, a "dies-in-spec" optimization may use prior knowledge of the product (the die layout) when optimizing a process parameter. A least squares optimization typically treats each location equally, without taking into account the die layout. As such, a least squares optimization may prefer a correction which "only" has four locations out-of-specification, but each in a different die, over a correction which has seven locations out-of-specification, but only affecting two dies (e.g., four defects in one die, three in another). However, as a single defect will tend to render a die defective, maximizing the number of defect-free dies (i.e., dies-in-spec) is ultimately more important than simply minimizing the number of defects per substrate. A dies-in-spec optimization may comprise a maximum absolute (max abs) per die optimization. Such a max abs optimization may minimize the maximum deviation of the performance parameter from a control target. A differentiable approximation for the max abs function could be used instead, so that the cost function is easier to solve. For this to be effective, detail such as the substrate map should be used in the optimization. To obtain a good yield-based process control, a sampling scheme for metrology measurements may benefit from measurements performed at, on or near locations which are expected to be most critical for yield and/or may be statistically most relevant to determine whether yield is affected. In addition to measuring properties of product features, the occurrence of defects may be measured to further assist in optimizing the process for optimal yield (reference defect inspection). More information on yield based control may be found in European patent application EP16195819.4, which is incorporated herein in its entirety by reference.

In addition to performing metrology measurements on pre-defined locations and substrates, there is a trend to dynamically allocate the locations and substrates which need to be selected for measurement. An example of dynamically selecting substrates for measurements is described in European Patent Application No. EP16195049.8 which is incorporated herein in its entirety by reference. More information on dynamic selection of measurement locations (e.g., sampling schemes) may be found in PCT Patent Application Publication No. WO 2017-140532 which is incorporated herein in its entirety by reference.

A relatively new technology area is the domain of machine learning. Methods relating to this technology are nowadays used to improve prediction of process parameters based on recognition of patterns present within the acquired data (measurements and context data). Additionally machine learning techniques may be useful to guide the user in selecting the data that is most useful for process control purposes.

Figure 4:
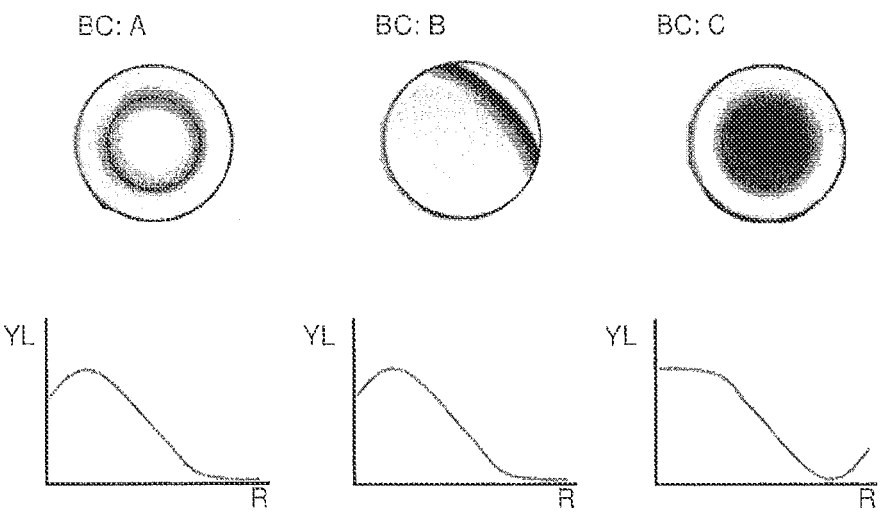
FIG. 4 depicts the fingerprint of various bin codes across a substrate and associated graphs of the expected yield loss (for the bin codes) versus the substrate radial position.

Electrical measurement data is typically obtained after processing of substrates. Typically, when performing electrical metrology to obtain the electrical measurement data, all the dies on the substrates are measured using one or more probes which make (near) contact to the circuits formed during the processing. Various types of measurements may be performed: voltage, current, resistance, capacitance and/or inductance measurements for example. These measurements may be performed under different conditions (frequencies, voltage, current for example) and at a plurality of locations across the die. An electrical measurement associated with a certain measured parameter (current, voltage, resistance, capacitance, inductance, etc.) at a certain condition is commonly referred to as a separate "bin code". Hence a typical electrical measurement across a die may be represented by a plurality of graphs, each graph representing a spatial distribution of values associated with a particular bin code. This is illustrated by FIG. 4, which shows across-substrate fingerprints associated with three bin codes (BC A, BC B and BC C), and corresponding plots of bin code values mapped to yield loss YL, as a function of substrate position (radius) R. Throughout the text, "bin code" and "electrical characteristic" is used synonymously such that a value of a bin code associated with the substrate is referred to as a value of an electrical characteristic of the substrate.

The distribution of the measurement locations for which the electrical measurements need to be performed may not be constant, but may also depend on the relative position of the die on the substrate. Dies at the edge of the substrate may be more likely to have an electrical defect, hence these dies may be sampled more densely than dies closer to the center of the substrate. Analogously, critical regions may be present within a die, such as those associated with, e.g., functional logic structures, while less critical regions may present, e.g., at the periphery of the die. It is advantageous to provide denser electrical measurement sample schemes at the critical regions of the dies than at the less demanding regions.

One or more properties (e.g., minimum value, maximum value, variance or any other statistical measure) of a measured electrical characteristic are a significant indicator regarding the probability that a certain product feature on a die will be functional. Hence a strong relationship exists between the electrical characteristic and the yield of the process. Hence for yield control, electrical characteristic measurements are significant. However, they are time consuming and are only performed at the end stage of the manufacturing process (e.g. when options for correcting non-functional product features are virtually absent).

To provide better yield correction capability to a manufacturing process, it proposed to predict the yield of a substrate based on data which is already available during the processing. During processing of the substrate, multiple layers are deposited, patterned and etched. The patterns (features) provided on the substrate should have well-defined properties in order to yield a functional device. For example features should be imaged at the correct focus position, have a correct critical dimension (CD), have correct edge placement (e.g., minimal edge placement error (EPE)) and have good overlay (e.g., each layer be aligned accurately to features associated with underlying layers). As stated previously, the lithographic apparatus (e.g., including the alignment system, leveling system, etc.) and the metrology apparatus (e.g., a scatterometer and/or e-beam tool) play a significant role in measuring these parameters, in some cases for all substrates within a lot. A special case is a so-called (low) voltage contrast e-beam microscope. This is a metrology tool which exposes an electric device to an electron beam in order to verify whether electrical contact of a certain layer with respect to its underlying layers meets certain requirements. Voltage contrast measurements comprise a method of measuring an electrical characteristic of the substrate.

Figure 5:
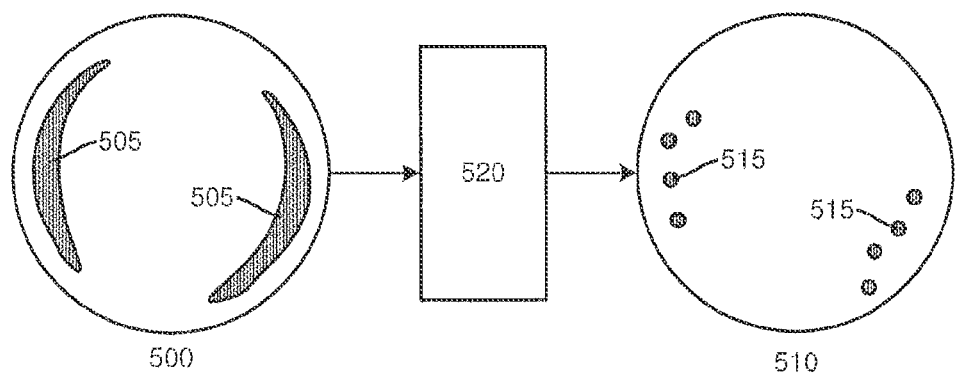
FIG. 5 is a schematic illustration of the determination of a relationship between a measured process characteristic and electrical probe data.

It is expected that the results of the metrology measurements (the metrology data) will be representative for a certain characteristic of the process, which in turn is expected to be closely related to the electrical characteristics that will be measured during the probe testing. FIG. 5 is a schematic illustration of the determination of a relationship between a measured process characteristic and electrical probe data. The Figure shows a process fingerprint 500 of the process characteristic, showing shaded regions 505 where the process characteristic is significantly out of specification. By way of specific example, the process characteristic may be focus and the fingerprint may be a focus error fingerprint associated with the substrate as obtained from level sensor data (e.g., from the lithographic apparatus). In such an example, the shaded regions show areas associated with large leveling error. Also shown is corresponding electrical probe data 510. Here the shaded circles 515 indicate out of specification probe measurements. As such, FIG. 5 demonstrates schematically that the process fingerprint 500 typically correlates with the electrical probe data 510. Also shown is a proposed data analysis step 520. The data analysis step 520 maps the process fingerprint 500 to the electrical probe data 510.

It will be appreciated that focus/leveling data is only one example of a process characteristic data. The process characteristic may comprise any measurable characteristic which affects yield. The process characteristic may be measured using, for example, a lithographic apparatus, another metrology apparatus, or another processing apparatus. For example when measuring an overlay fingerprint using a metrology device such as a scatterometer, it is expected that the locations on the substrate having large overlay errors will correlate strongly with deviating (out of specification) electrical characteristic measurements (e.g., due to sub-optimal electrical contact of the layers on the substrate) and therefore non-functional devices. The underlying process characteristic causing this specific overlay fingerprint may, for example, be an annealing step performed between the patterning of the two layers. In addition to deforming the substrate (thereby causing the overlay error), electrical conductance of material may be affected during the annealing step, resulting in an additional contribution to an expected impact on the electrical characteristic measurements.

The process characteristic may further be determined using fingerprint decomposition techniques. When measuring an overlay fingerprint it may be beneficial to decompose the fingerprint into, for example, pre-defined shapes. The pre-defined shapes may be selected based on a priori knowledge of certain characteristics of the processing steps and/or processing tools. A common technique to decompose fingerprints uses Principal Component Analysis (PCA) or an eigenvalue decomposition method. Instead of utilizing the directly measured fingerprint of the parameter of interest (for example overlay), separate components of the fingerprint are considered. PCA (and Independent Component Analysis (ICA)) methods within this context are described in PCT Patent Application Publication No. WO 2015-049087, which is incorporated herein in its entirety by reference.

It is therefore proposed to use metrology data obtained at any stage during the processing of the substrate for predicting an electrical characteristic. A method to achieve this comprises determining a sensitivity of each of one or more electrical characteristics to one or more relevant process characteristics. The process characteristic may be a certain process step condition manifesting itself as a certain fingerprint of one or more parameters, such as overlay, CD, alignment or focus. A specific example of a process characteristic may be a setting of an etch tool which manifests itself as a particular combination of overlay fingerprint and alignment fingerprint, such as a strong radially directed overlay fingerprint and a flat alignment fingerprint.

Determining the sensitivity may be performed by analyzing historic data of already processed substrates for which both metrology data and electrical characteristic measurements are available. A simple implementation would be to relate a fingerprint of a process characteristic (for example an overlay fingerprint of features on different layers, in this case as measured after etching of the features) to an associated fingerprint of measured values of the electrical characteristic. This defines a function mapping a fingerprint associated with a process characteristic to an electrical characteristic fingerprint (as would be measured on the end product). This mapping function may be defined for all relevant layers on the substrate. Alternatively or additionally, a model may be trained which maps the available one or more process characteristics to a predicted value of the electrical characteristic per substrate, per layer, per die or per functional area within a die. This model may be a parametric model, a neural network model, a Gaussian model, a deep net model, a logistic model or any other model suitable to be trained with data. In general a flexible model may be preferred, such as a model which adapts to the size of the (metrology) data sets, number of bin codes that need to be predicted, and/or complexity of the device (e.g., number of layers, number of critical features on the die, etc.).

In addition to using metrology data to establish the sensitivity of each of one or more various electrical characteristics (e.g. bin codes) to the process characteristics, it is often beneficial to make use of design knowledge of the device. Based on patterning device layout data it can be predicted what the electrical characteristic will be. In particular, critical locations may be identified for which knowledge of one or more electrical characteristics will be most informative (e.g. most useful for predicting the yield of the process). Hence it may be beneficial to take these locations into account for selection of metrology sample locations and subsequent process control actions.

The sensitivities of the electrical characteristics to the various process characteristics may be represented as a Pareto chart, indicating the relative importance of process characteristics to certain electrical characteristics. The Pareto chart allows the user to determine which processes should be controlled (e.g., to improve yield), using further knowledge of which electrical characteristics (bin codes) are most relevant for the yield of the process as a whole.

Once the model or function describing a sensitivity of the electrical characteristic to the process characteristic (as represented by metrology data) is determined, it is possible to derive estimates of the electrical characteristic associated with the substrate for further substrates during processing. With new metrology data becoming available, the estimate of the electrical characteristic may be refined. In some cases, a low voltage contrast measurement may be performed on specific layers. Where this is so, in order to verify the predicted electrical characteristic based on the one or more process characteristics, the voltage contrast measurement may be used as a reference. Should the predicted electrical characteristic not be consistent with the voltage contrast measurement, the model or function generating the sensitivities of the electrical characteristics to the one or more process characteristics may need adaptation. Hence the sensitivities of the electrical characteristics will tend to improve during the processing of the substrate, giving an increasingly accurate indication of whether the end product (e.g., an IC) will perform according to its electrical specifications. In addition, the one or more predicted electrical characteristic are available for a plurality of locations on the substrate. At any stage of the processing of the substrate, this information may be used to optimize sample schemes of metrology measurements and/or indicate at which locations probe measurements will be most informative.

Often, processing tools are equipped with actuators controlling process characteristics in a predictable fashion. For example, a lithographic apparatus typically has a dose manipulator which is capable of accurately controlling a CD fingerprint across a die, or across a certain region within the die (for example a region associated with a critical circuit). Typically, most actuators within processing tools are used to individually minimize deviation of one or more various process characteristics or one or more related parameters (focus, CD, overlay, dose for example) from a target. The cost function of the process control may comprise a function of the root mean square error of the difference between the target process characteristic and the measured process characteristic. However this strategy may not be optimal for maximizing yield of the process. It is therefore proposed to use the one or more derived sensitivities of an electrical characteristic to one or more process characteristics for controlling the tools used in the manufacturing process.

In an embodiment, a yield model based on the sensitivities of the electrical characteristics to one or more process characteristics is determined. The sensitivities of a number of the electrical characteristics (bin codes) to one or more relevant process characteristic(s) may be determined for each layer. As such a yield model may be based on a combination of determined sensitivities, each of the determined sensitivities relating to a particular bin code. The combinations may be determined first per-layer to determine a yield model for each layer, and then, in turn combined to determine a yield model for the layers of a die or substrate. In an example, the yield model may be constructed by considering the sensitivities of the electrical characteristics to the process characteristic(s) of interest, while also taking into account the relative importance of each electrical characteristic with respect to an expected yield loss. For example, an electrical characteristic (specific bin code) associated with a voltage measurement on a critical feature (i.e., a feature which needs to be formed with a certain parameter in a narrow range—i.e., has a small process window—in order for the device to be functional) will be given greater weighting than an electrical characteristic (bin code) associated with a non-critical measurement on a feature in a non-critical area on the die. Hence the yield model may be a weighted function of electrical characteristics, wherein each electrical characteristic is also a function of a process characteristic. As process characteristics are typically applicable for multiple layers, the yield model should also take the multiple layers into account. This often means that a process characteristic is also weighed with a certain factor indicating the criticality of the layer within the yield model, with the weighted process combination then summed across the layers. Other implementations of yield models may also be conceived. For example, the yield function may be a logical function of certain electrical characteristic (bin code) values, wherein an electrical characteristic value is first translated to a "false" (outside specified range) or "true" (within specified range) value. Equivalently, the yield function may be binary in a sense that it verifies whether values of a group of electrical characteristics (e.g., plurality of bin codes) is within, or outside of, a non-yielding range.

Figure 6:
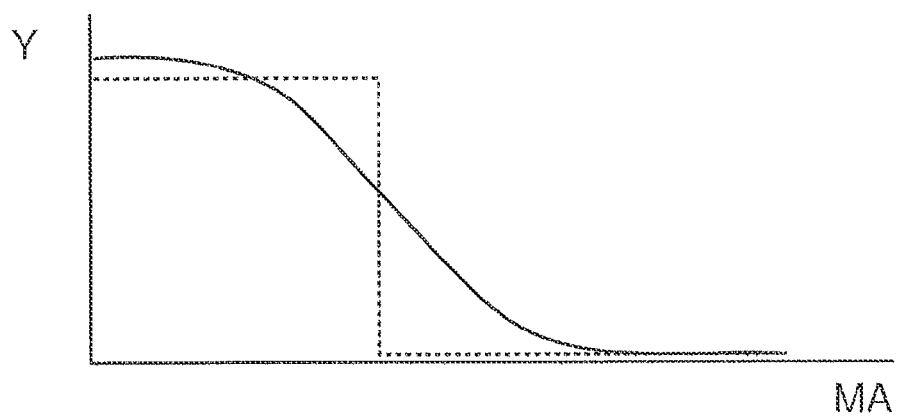
FIG. 6 is an exemplary yield model comprising a plot (solid line) of yield Y on the y-axis against a process characteristic (e.g., a focus parameter) MA on the x axis.

FIG. 6 shows an exemplary yield model comprising a plot (solid line) of yield Y (on the y-axis) against a process characteristic (e.g., a focus parameter) MA (on the x axis). It can be seen that the yield depends on the focus parameter MA in accordance with a certain functional dependency (in this case for a specific layer). The precise slope of the logistic function defined by the solid line is unknown and should be trained. Learning algorithms based on backpropagation of the error are often based on a logistic or sigmoid function, since they lead to differentiable error gradients which can be backpropagated in case of more complex probability models. Here only the logistic model is shown. The dotted line (step function) shows the dependence of yield on MA error. Schematically, the step function means that above a certain critical MA error, the die is never yielding. In practice, a combination of factors additional to MA may explain yield loss, so an uncertain (probabilistic) relation between yield and MA is expected.

For individual layers, the yield may be determined as:

$$\text{yield} = \Pi MA_i$$

and may comprise a weighted combination of layers (where $w_i$ is the weight):

$$\text{yield} = \Sigma w_i \times MA_i$$

where the subscript i refers to the layer and $MA_i$ describes the MA error per layer. Final die yield will depend on the combination of MA errors of all the preceding layers, and may be a weighted sum or product.

In an embodiment, the yield model may be hierarchical, comprising multiple yield models arranged according to a hierarchy having two or more levels (e.g., one level may be a per-lot yield model, another level may be a per-substrate yield model). In principle a single (non-hierarchical) yield model takes the whole substrate area into account. However, it may be beneficial to focus on particular regions on the substrate at die level or within particular areas within a die (associated with critical functional components). For example, the substrate may be divided into two or more regions e.g., edge region, center region and possibly one or more intervening regions. In such an embodiment, a hierarchical yield model may comprise five levels (or a subset of these), where level 1 may be a per-lot model; level 2, a per-substrate model; level 3, a model relating to a particular region on the substrate; level 4, a model relating to a particular die on the substrate; and level 5, a model relating to an area within a die associated with a certain electrical functionality. This enables the yield to be predicted on a per-lot basis, per-substrate basis, per region on the substrate basis or per die basis. Hence, it becomes possible to track whether particular substrates, regions, dies or functional areas within a die are prone to yield losses.

Typically, at present, the yield of a process can only be determined at the end of the process by probing the devices and determining how many dies out of the total have electrical characteristics which conform to specification. However, by utilizing a method of (continuously) predicting the electrical characteristics based on available metrology data, it is possible to predict the yield of the process at any stage.

The process itself may be controlled based on the predicted yield. Instead of optimizing a certain fingerprint of the metrology data (for example the average overlay between two layers) a correction for one of the process apparatuses (e.g., an etch apparatus, a lithographic apparatus, etc.) may be determined which improves or maximizes yield of the process. The control strategy may evolve during processing of the substrates, as and when new metrology data becomes available (which may include low voltage contrast measurement data); the yield model may be updated, and the result of a modified control strategy may be estimated by using the yield model and the latest available metrology data. This way, the process control adopts a reinforcement learning approach, wherein control strategy modifications are evaluated and fed forward to guide a new update of the control strategy which is targeted to improve the yield of the process as a whole. An example of such a strategy would be the processing of a substrate which involves the application of a large number of layers, each layer having a specific relevance for the electrical characteristic and each layer comprising features having a specific associated critical process characteristic (for example a first layer comprising isolated features being sensitive to a focus characteristic and a second layer comprising dense features being sensitive to an overlay characteristic). During processing of a first layer the leveling data is used to predict the yield for the substrate and an appropriate focus control strategy is utilized to optimize the yield (potentially lowering yield for certain dies, for the sake of obtaining a large number of yielding dies). Before application of the second layer overlay data becomes available allowing a second prediction of the yield. Before applying the overlay correction to the processing of the second layer it may be advisable to verify the effectivity of the previous correction (first layer) using, e.g., a low voltage contrast measurement as this is strongly indicative of the yield associated with that layer. If the low voltage contrast measurement reveals that the first correction delivered sub-optimal results, the yield model may be updated and the control strategy adopted during application of the second layer modified appropriately to compensate the mismatch between the first correction (e.g. the first control strategy) and the yield improvement actually observed.

In an embodiment, a yield maximization optimization (i.e., a dies-in-spec optimization) may be further improved by using a "dead dies" database. Such a database may be maintained dynamically and records all instances where a die is estimated to have at least one defect, whereby it is considered to be dead (defective). Such dead dies may then be further sacrificed in any optimization (weighting). This may be achieved by attributing a very large or limitless process window to the dead die, beyond that of the actual limits for it to be functional. By increasing the likelihood of more defects in the dead die, more flexibility may be provided for optimization or control for the other dies. This may therefore lower the likelihood of a defect in another die in an optimization for that same layer, or for successive layers, thereby further improving or maximizing the number of dies-in-spec.

In addition the control strategy may be selected using simulation of a plurality of control strategies and their effect on the yield of the final product. For example the effect of choosing a different alignment strategy, a different dose setting, one or more various focus control settings (as implemented by control of one or more projection system characteristics), etc. may be simulated. The effect on the process characteristic is determined for all these control strategies as well as their impact on the yield (using the yield model). The control strategy leading to an optimum yield of the process may be selected and subsequently used to process further layers on the substrate, or further substrates for the current layer.

The process control strategy as given above demonstrates that manufacturing process control strategies are becoming increasingly holistic. The strategy becomes aware of the yield, aware of what tools are capable of correcting what process characteristics and in addition become dynamically adapting strategies. Historic data is used to predict the yield of the process, detailed process simulations are performed to define process corrections needed to optimize the yield and information is fed forward to future process correction steps to further optimize yield of the process.

The process control is typically coordinated by a controller being a computing device in connection with one or more of the apparatus participating within the manufacturing process (e.g., etching device, lithographic apparatus (scanner), etc.). Alternatively the controller is a module built in one of the apparatuses or metrology tools.

Figure 7:
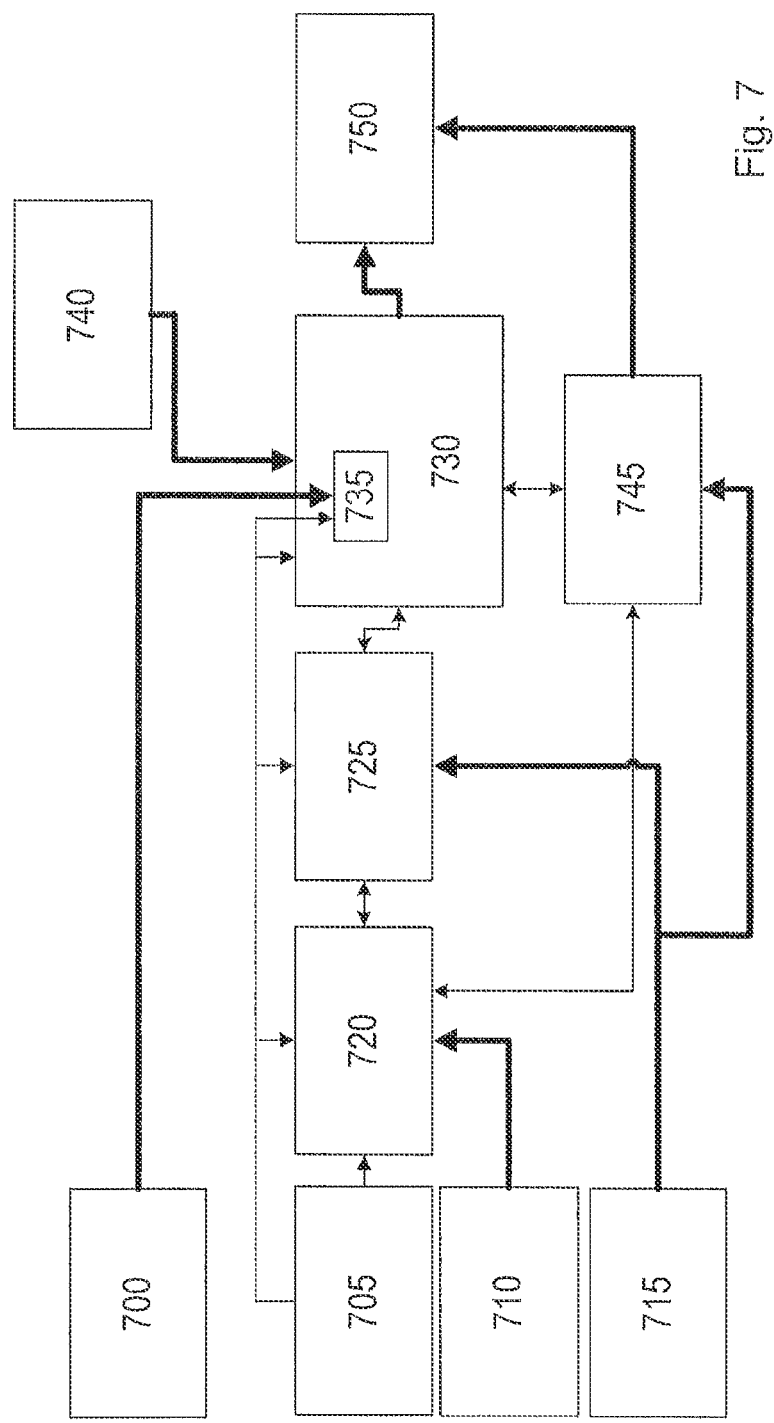
FIG. 7 is a flowchart of a method according to an embodiment of the invention.

FIG. 7 is a flow diagram illustrating an embodiment of the yield estimation process described above. The connections are shown as bold arrows, while the thinner arrows indicate the machine learning calibration steps of the yield model according to an embodiment. The yield model predicts substrate, die or feature level failure rates. The blocks shown are the physical design data and/or computational lithography data 700, the lithographic apparatus (scanner) metrology 705, other processing apparatus (e.g., fab) metrology 710, substrate context information 715, a fingerprint library 720, lithographic apparatus (scanner) control 725, yield model 730 (which may include a sensitivity and feature extraction data function 735), electrical probe/yield data 740, root cause estimation function 745 and visualization model 750.

Based on design data (e.g., from reticles) and electrical measurement data, a machine learning approach is adopted to determine representative features (typically critical for yield) associated with a yield model 730. The yield model 730 may be configured to predict the yield for the representative features based on lithographic apparatus (scanner) metrology data 705, fab metrology data 710 and/or context data 715. On receiving more metrology data 705, 710, 715 and electrical measurement data 740, the yield model 730 improves by learning how to predict electrical measurement and/or yield data with increasing accuracy based on metrology and/or context data input. After sufficient learning, the yield model 730 may be utilized to predict electrical measurement and/or yield data based on metrology 705, 710 and/or context data 715 and become an input to a lithographic apparatus (scanner) control 725 and/or root cause diagnostic function 745.

A root cause diagnostic function 745 may be provided for root cause diagnosis based on the context data 715 and the lithographic apparatus (scanner) control 725. The root cause diagnostic function 745 may additionally use one or more expected fingerprints (comprised within a fingerprint library 720) which relate to a substrate associated with a particular lithographic apparatus (scanner) or fab metrology occurrence. In addition, lithographic apparatus (scanner) control 725 may be based on the context data 715 (for example, knowledge of the particular processing tool used for a processing task may be used to determine a certain control recipe). Furthermore, determined root causes of low yield occurrences may be linked to a particular fingerprint within the fingerprint library 720 using machine learning methods. Results of the yield model and/or root cause determination may be visualized by a visualization module 750. For example visualization module 750 may show a substrate map of expected defects based on obtained metrology data and utilization of the yield model 730.

In the above, the relationship between metrology performed during processing, (e.g., scatterometer based metrology) and measurement of an electrical characteristic is used to model yield, and thereon to control processing to improve or maximize yield based on predictions using the yield model. A couple of additional or alternative specific applications for the determined relationship between metrology performed during processing and electrical characteristic metrology will now be described.

As previously mentioned, there is sometimes a metrology-to-device (MTD) offset which means that the optimal value for a process characteristic (e.g., overlay) as measured by a metrology mark does not necessarily result in optimal yield. There are process and optical reasons for this offset and estimating the MTD offset across the lithographic apparatus (scanner) field/projection system and across the substrate is very slow and painstaking. This means this important parameter is not updated sufficiently often or is not estimated accurately.

To address this, it is proposed to correlate dense process characteristic maps (e.g., overlay maps) with yield data (e.g., electrical characteristic data or yield data determined using a yield model as described above) to determine a high spatial resolution distribution estimate of yield against the process parameter. This distribution estimate can, in turn, be used to calibrate the MTD offset. In terms of overlay, the non-MTD offset may be referred to as a "non-zero offset", e.g., an offset between zero (e.g., optimal) overlay as measured using an overlay target and an overlay value which provides optimal yield. Conventional control techniques, by comparison, will tend to control the lithographic process to minimize overlay (i.e., to zero). Other process parameters (e.g., CD) may have a non-zero nominal target in any case, and therefore the MTD offset will be an offset with respect to this nominal optimal target value.

Virtual and/or hybrid metrology methods as disclosed PCT application WO2017144379, which is herein incorporated by reference in its entirety, may be performed to generate suitably dense overlay maps for an expected overlay range, using models of intra substrate and intra field overlay in combination with results of actual overlay metrology (e.g., after develop inspection (ADI) metrology). Alternatively such a method of virtual and/or hybrid metrology is referred to as "computational metrology". The yield data may comprise bitmap data (e.g., for memory ICs) such as obtained from electrostatic discharge testing, the aforementioned electrical probe tests, scan fault isolation tests, etc. In an embodiment, the correlation of the overlay and yield data domains is performed per substrate (e.g., per location/region) and the distribution used to determine the optimal overlay target value which maximizes yield for a certain overlay budget.

As such, this embodiment describes a method for determining a value of a control parameter for lithographic processing of substrates, the method comprising: obtaining values of the control parameter across a substrate; obtaining values of a yield parameter (e.g., electrical characteristic data or estimated yield data) across the substrate; correlating the values of the yield parameter to the values of the control parameter to obtain a model relating control parameter values to expected yield parameter values; and determining the control parameter based on the model and an expected range of the control parameter associated with the lithographic processing.

Figure 8:
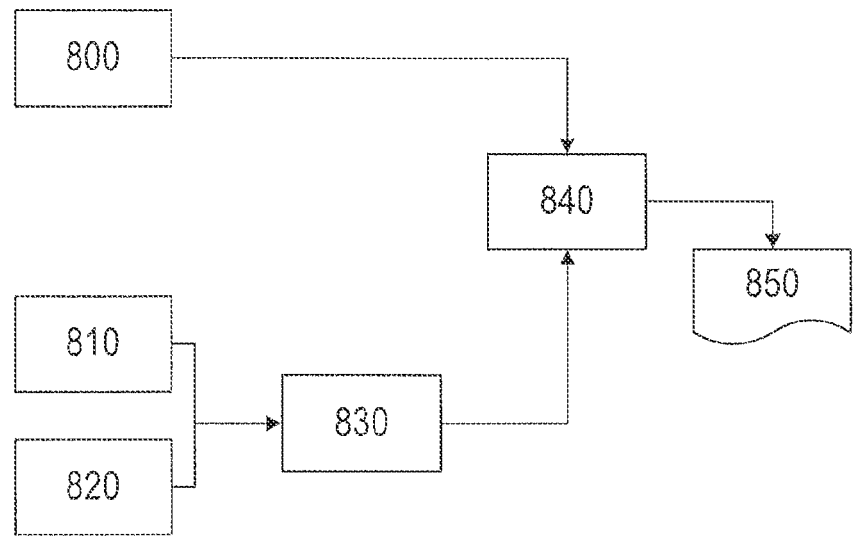
FIG. 8 is a flowchart of a method according to an embodiment of the invention.

FIG. 8 shows a flowchart describing such an embodiment used in an overlay context. ADI overlay metrology data 810 and leveling data 820 (e.g., from a level sensor) is used in a computational metrology technique to determine dense overlay data 830, modelled per die. This is correlated with yield data 800 in a non-zero offset model calibrator 840. The output 850 of the non-zero offset model calibrator 840 is a non-zero offset overlay value and associated overlay margin. Where the yield data 800 is determined using a yield model, e.g., using a method of the earlier described embodiments, this embodiment may comprise a method of process control which uses the output of the yield model. More specifically, the method may use the estimated yield from the yield model to determine a non-zero overlay offset (or other process parameter offset) and therefore determine a suitable correction for a process characteristic to implement the non-zero offset so as to increase yield.

A further specific implementation of the general teachings described herein is to control formation of memory channel hole in a 3D-NAND manufacturing process. To define memory holes in 3D-NAND manufacturing, an extreme high aspect ratio etch from top to bottom of the multilayer stack is used. Issues with channel hole formation include incomplete etching and twisting, resulting in a loss of yield. These issues can be detected effectively using voltage contrast metrology (measurement of an electrical characteristic of the substrate). Presently, much of the process control, more specifically the etch control, relates to the shape of the original lithography and in particular the hardmask profile. Voltage contrast metrology today is a very accurate, low cost technique; however it can be applied only after etch and after contacting. This means that any failing die due to incomplete memory hole etch cannot be reworked and is hence a lost die.

It is therefore proposed to determine a correlation between voltage contrast metrology (electrical characteristic) and ADI/AEI optical metrology (process characteristic metrology) to control the lithographic step which defines the memory channel holes.

Such a method may comprise collecting for a set of substrates, after exposure, both CD-ADI measurements (CD measurements performed after development—i.e., in resist), CD-AEI measurements (CD measurements performed after etch) and voltage contrast measurements. The voltage contrast metrology may provide the most accurate information on properly contacted and non-contacted channels, and can thus be most representative for yield. The CD-ADI and CD-AEI metrology are to be used as control setpoints.

In particular, the ADI and AEI ellipticity, and the ellipticity change between AEI and ADI metrology, is expected to be indicative for proper etch, and therefore proper connection and voltage contrast reading. After determining the ellipticity required to obtain a proper voltage contrast reading, the CD can be controlled (e.g., by higher order dose control of the exposure process) to help ensure improved definition and contacting of the channels. In addition, control of the wavefront aberrations of the projection system can be used to optimize the process window for achieving the appropriate ellipticity. The ellipticity control may be extended by providing a feedback to the etcher (e.g., co-optimization of lithographic apparatus/etcher). Sampling plans for each metrology technology should be such that the resolution of ADI or AEI metrology is coupled with the occurrence of voltage contrast black dots in a particular area.

Figure 9:
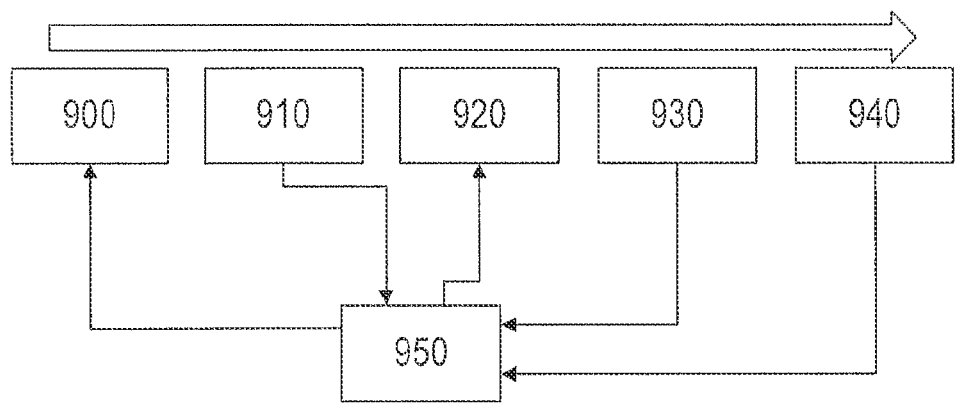
FIG. 9 is a flowchart of a method according to an embodiment of the invention.

FIG. 9 is a flowchart which describes an embodiment of the proposed method. A lithographic apparatus (scanner) 900 is used to expose a substrate and the CD is measured in resist (CD-ADI) 910. The substrate is etched within an etch apparatus 920, and the CD measured again (CD-AEI) 930. Voltage contrast metrology 940 is then performed on the substrate. The result of the metrology steps 910, 930, 940 are fed to a processor which performs a computational lithography step 950 which correlates the CD-ADI metrology 910 and/or CD-AEI metrology 930 with the voltage contrast metrology 940. The correlation may correlate only CD-ADI metrology 910 (e.g., ellipticity profiles) or CD-AEI metrology 930 (e.g., ellipticity profiles) with the voltage contrast metrology 940. In a specific embodiment, this correlation may comprise correlating the difference between the CD-ADI metrology 910 and CD-AEI metrology 930 with the voltage contrast metrology 940. More specifically still, the difference between the CD-ADI metrology 910 and CD-AEI metrology 930 may comprise a measure of the change in ellipticity in channel holes measured during the CD-ADI metrology 910 and CD-AEI metrology 930. Step 950 may determine a correction or adjustment for the lithographic apparatus 900 so as to control (minimize) ellipticity in ADI memory hole formation, as imaged (i.e., in resist). Alternatively, or in combination, step 950 may determine a correction or adjustment for the etch apparatus 920 so as to control ellipticity of a hard mask for the memory hole formation. Where step 950 controls both lithographic apparatus 900 and etcher 920, then a co-optimization for minimization of ellipticity in the etched memory hole may be implemented. Step 950 may also comprise providing rework notifications after lithography or hard mask etch if the available control methods are not able to provide acceptable hole profiles after etch.

In an embodiment, there is provided a method of predicting an electrical characteristic of a substrate subject to a manufacturing process, the method comprising: determining a sensitivity of the electrical characteristic to a process characteristic represented by a fingerprint of a parameter across a substrate based on analysis of fingerprints of the parameter and measured electrical characteristics for a set of processed substrates; determining an actual fingerprint of the parameter based on metrology data of the substrate; and predicting the electrical characteristic of the substrate based on the sensitivity and the actual fingerprint.

In an embodiment, the electrical characteristic is associated with a resistance, inductance, or capacitance between at least two layers applied during processing of the substrate. In an embodiment, the determining of the sensitivity of the electrical characteristic to the process characteristic comprises using a function mapping a property of the parameter to a property of the electrical characteristic. In an embodiment, the property of the parameter is a fingerprint of the parameter across a substrate. In an embodiment, the property of the parameter is a value and/or an uncertainty of the parameter at a location on a substrate. In an embodiment, the property of the electrical characteristic indicates meeting a pre-determined specification. In an embodiment, the function is dynamically updated during the manufacturing process based on new metrology data and/or measured electrical characteristic data. In an embodiment, the function is configured as a machine learning application. In an embodiment, the function is a logistic model. In an embodiment, the parameter is associated with one or more selected from: in-plane deformation of a substrate, out-of-plane deformation of a substrate, critical dimension of a feature applied to a substrate, received dose of a feature applied to a substrate, overlay data indicating a positional shift between features, and/or low voltage contrast measurements indicating an electrical conductance between at least two layers on a substrate. In an embodiment, the determining of the sensitivity of the electrical characteristic to the process characteristic further comprises determining a location on the substrate for which an additional measurement of the parameter is most informative. In an embodiment, the determining of the sensitivity of the electrical characteristic to the process characteristic further comprises verification of the function based on a comparison of the determined sensitivity with a voltage contrast measurement. In an embodiment, the determining the fingerprint of the parameter based on metrology data further comprises decomposing the fingerprint of the parameter into separate components. In an embodiment, the decomposing is based on a PCA method. In an embodiment, the method further comprises determining a yield associated with the process based on the determined electrical characteristic. In an embodiment, the yield is a weighted sum of electrical characteristics. In an embodiment, the method further comprises determining a correction to the process based on an expected change of the yield, wherein the change of the yield is determined using an expected change of the process characteristic, the sensitivity of the electrical characteristic to the process characteristic and the determining of the yield based on the electrical characteristic. In an embodiment, the process characteristic is represented by a plurality of fingerprints of a plurality of parameters across a substrate and a plurality of fingerprints of the parameter are determined for the substrate based on the metrology data. In an embodiment, the determining of the sensitivity of the electrical characteristic to the process characteristic comprises using a function mapping the plurality of fingerprints of the plurality of parameters to the electrical characteristic. In an embodiment, the plurality of parameters are one or more selected from: alignment parameters, leveling parameters, overlay parameters, critical dimension parameters after development, and/or low voltage contrast measurements. In an embodiment, the function is a Pareto chart indicating the relative significance of an individual fingerprint of an individual parameter in the determining of the electrical characteristic.

Further embodiments of the invention are disclosed in the list of numbered embodiments below:

1. A method for predicting an electrical characteristic of a substrate subject to a process, the method comprising:
   determining a sensitivity of the electrical characteristic to a process characteristic, based on analysis of electrical metrology data comprising measured electrical characteristics from previously processed substrates and process metrology data comprising measurements of at least one parameter related to the process characteristic measured from the previously processed substrates;
   obtaining process metrology data related to the substrate describing the at least one parameter; and
   predicting the electrical characteristic of the substrate based on the sensitivity and the process metrology data.

2. The method according to embodiment 1, wherein the electrical characteristic is associated with a resistance, inductance or capacitance between at least two layers applied during processing of the substrate.

3. The method according to any preceding embodiment, wherein the determining of the sensitivity of the electrical characteristic to the process characteristic comprises using a function mapping a property of the process metrology data to a property of the electrical metrology data.

4. The method according to embodiment 3, wherein the property of the process metrology data is a value and/or an uncertainty of the parameter at a location on a substrate.

5. The method according to embodiment 3, wherein the property of the process metrology data is a fingerprint of the parameter across a substrate, the fingerprint describing values for the parameter across the substrate, or part thereof.

6. The method according to embodiment 5, wherein the obtaining process metrology data comprises determining a fingerprint of the parameter based on metrology data.

7. The method according to embodiment 6, wherein the determining a fingerprint further comprises decomposing the fingerprint of the parameter into separate components.

8. The method according to embodiment 7, wherein the decomposing is based on a PCA method.

9. The method according to any of embodiments 6 to 8, wherein the parameter comprises a plurality of parameters and the process characteristic is represented by a plurality of fingerprints describing the plurality of parameters across the substrate or part thereof, and a plurality of fingerprints of the parameter are determined for the substrate based on the metrology data.

10. The method according to embodiment 9, wherein the determining of the sensitivity of the electrical characteristic to the process characteristic comprises using a function mapping the plurality of fingerprints of the plurality of parameters to the electrical characteristic.

11. The method according to embodiment 10, wherein the plurality of parameters are one or more selected from: alignment parameters, leveling parameters, overlay parameters, critical dimension parameters after development, and/or low voltage contrast measurements.

12. The method according to any of embodiments 5 to 11, wherein the function is a Pareto chart indicating the relative significance of an individual fingerprint of an individual parameter in the determining of the electrical characteristic.

13. The method according to any of embodiments 3 to 12, wherein the property of the electrical metrology data indicates meeting a pre-determined specification.

14. The method according to any of embodiments 3 to 13, wherein the function is dynamically updated during the process based on new process metrology data and/or new electrical metrology data.

15. The method according to embodiment 14, wherein the function is configured as a machine learning application.

16. The method according to any of embodiments 3 to 13, wherein the function is a logistic model.

17. The method according to any of embodiments 3 to 16, wherein the determining of the sensitivity of the electrical characteristic to the process characteristic further comprises verification of the function based on a comparison of the determined sensitivity with a voltage contrast measurement.

18. The method according to any preceding embodiment, wherein the parameter is associated with one or more selected from: in-plane deformation of a substrate, out-of-plane deformation of a substrate, critical dimension of a feature applied to a substrate, received dose of a feature applied to a substrate, overlay data indicating a positional shift between features, and/or low voltage contrast measurements indicating an electrical conductance between at least two layers on a substrate.

19. The method according to any preceding embodiment, wherein the parameter is associated with ellipticity in the formation of channel holes within a memory stack.

20. The method according to embodiment 19, wherein the parameter is a change in ellipticity after exposure of the channel holes, between before performance of an etch step and subsequent to performance of the etch step.

21. The method according to any preceding embodiment, wherein the electrical metrology data has been obtained, at least in part, using voltage contrast metrology.

22. The method according to any preceding embodiment, wherein the electrical metrology data has been obtained, at least in part, using electrical probe measurements.

23. The method according to any preceding embodiment, wherein the predicted electrical characteristic of the substrate is compared to further process metrology data to determine a metrology offset between a nominal optimal parameter value as measured by a metrology device and an actual optimal parameter value which improves or optimizes yield.

24. The method according to embodiment 23, wherein the process metrology data comprises simulated data obtained using computational metrology techniques so as to model the effect of parameter values over a range of interest.

25. The method according to any preceding embodiment, wherein the determining of the sensitivity of the electrical characteristic to the process characteristic further comprises determining a location on the substrate for which an additional measurement of the parameter is most informative.

26. The method according to any preceding embodiment, further comprising determining a yield associated with the process based on the determined electrical characteristic.

27. The method according to embodiment 26, wherein the yield is a weighted sum of electrical characteristics.

28. The method according to embodiment 26 or embodiment 27, further comprising determining a correction to the process based on an expected change of the yield, wherein the expected change of the yield is determined using an expected change of the process characteristic, the sensitivity of the electrical characteristic to the process characteristic and the determining of the yield based on the electrical characteristic.

29. The method according to embodiment 28, wherein the correction is determined to maximize yield.

30. The method according to embodiment 28 or embodiment 29, wherein the correction optimizes an exposure step of the process, an etch step of the process, or co-optimizes an exposure step of the process and an etch step of the process.

31. The method according to any of embodiments 26 to 30, wherein the yield is compared to further process metrology data to determine a metrology offset between a nominal optimal parameter value as measured by a metrology device and an actual optimal parameter value which improves or optimizes yield.

32. The method according to embodiment 31, wherein the parameter is overlay and the actual optimal parameter is a non-zero value.

33. The method according to embodiment 31 or embodiment 32, wherein the process metrology data comprises simulated data obtained using computational metrology techniques so as to model the effect of parameter values over a range of interest.

34. A method of determining a value of a control parameter for a process involving lithographic processing of substrates, the method comprising:
    obtaining values of the control parameter across a substrate;
    obtaining values of a yield parameter across the substrate;

correlating the values of the yield parameter to the values of the control parameter to obtain a model relating control parameter values to expected yield parameter values; and determining the control parameter based on the model and an expected range of the control parameter associated with the process.

35. The method according to embodiment 34, wherein the determining the control parameter comprises determining a metrology offset between a nominal optimal control parameter value as measured by a metrology device and an actual optimal control parameter value which improves or optimizes yield.

36. The method according to embodiment 34 or embodiment 35, further comprising controlling the process for subsequent substrates by driving the control parameter towards an optimal control parameter value.

37. The method according to embodiment 35 or embodiment 36, wherein the control parameter is overlay and an actual optimal control parameter value is a non-zero value.

38. A computer program comprising instructions for a processor system which cause the processor system to perform the method of any preceding embodiment.

39. A processor system and associated program storage, the program storage comprising instructions for the processor system which cause the processor system to perform the method of any of embodiments 1 to 37.

40. A lithographic apparatus and/or metrology apparatus comprising the processor system and associated program storage of embodiment 39.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a patterning device inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

The term "optimizing" and "optimization" as used herein refers to or means adjusting a lithographic apparatus, a patterning process, etc. such that results and/or processes of lithography or patterning processing have more a desirable characteristic, such as higher accuracy of projection of a design layout on a substrate, a larger process window, etc. Thus, the term "optimizing" and "optimization" as used herein refers to or means a process that identifies one or more values for one or more variables that provide an improvement, e.g. a local optimum, in at least one relevant metric, compared to an initial set of one or more values for those one or more variables. "Optimum" and other related terms should be construed accordingly. In an embodiment, optimization steps can be applied iteratively to provide further improvements in one or more metrics.

While specific embodiments of the disclosure have been described above, it will be appreciated that the disclosure may be practiced otherwise than as described. For example, the disclosure may take the form of a computer program containing one or more sequences of machine-readable instructions describing a method as disclosed above, or a data storage medium (e.g. semiconductor memory, magnetic or optical disk) having such a computer program stored therein.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method comprising:
    obtaining a machine learning model trained to metrology data comprising measurements of an electrical characteristic from previously processed substrates and process metrology data comprising measurements of at least one parameter related to a process characteristic measured from the previously processed substrates;
    obtaining process metrology data related to a substrate comprising the at least one parameter; and
    providing the obtained process metrology data to the machine learning model for predicting an electrical characteristic of the substrate; and
    dynamically updating the machine learning model based on new process metrology data and/or new metrology data.

2. The method according to claim 1, wherein the obtained process metrology data comprises a value and/or an uncertainty of the at least one parameter at a plurality of locations on the substrate.

3. The method according to claim 1, wherein the machine learning model comprises a logistic model.

4. The method according to claim 1, wherein the machine learning model is based on a method of reinforcement learning.

5. The method according to claim 1, wherein the metrology data has been obtained, at least in part, using voltage contrast metrology or electrical probe measurements.

6. The method according to claim 1, wherein the process metrology data comprises simulated data.

7. A method comprising:
    obtaining, across a substrate, values of a control parameter for a process involving lithographic processing of substrates;
    obtaining values of a yield parameter across the substrate;
    correlating the values of the yield parameter to the values of the control parameter to obtain a model relating control parameter values to expected yield parameter values; and
    determining the control parameter based on the model and an expected range of the control parameter associated with the process, wherein the determining the control parameter comprises determining a metrology offset between a nominal optimal control parameter value as measured by a metrology device and an actual optimal control parameter value which improves or optimizes yield.

8. The method according to claim 7, wherein the control parameter is overlay and an actual optimal control parameter value is a non-zero value.

9. The method according to claim 7, further comprising controlling the process for subsequent substrates by driving the control parameter towards an optimal control parameter value.

10. The method according to claim 7, wherein the values of the yield parameter have been obtained, at least in part, using voltage contrast metrology or electrical probe measurements.

11. A computer program product comprising a non-transitory computer-readable medium comprising instructions therein, the instructions, upon execution by a processor system, configured to cause the processor system to at least:
obtain, across a substrate, values of a control parameter for a process involving lithographic processing of substrates;
obtain values of a yield parameter across the substrate;
correlate the values of the yield parameter to the values of the control parameter to obtain a model relating control parameter values to expected yield parameter values; and
determine the control parameter based on the model and an expected range of the control parameter associated with the process, wherein the determination of the control parameter comprises determination of a metrology offset between a nominal optimal control parameter value as measured by a metrology device and an actual optimal control parameter value which improves or optimizes yield.

12. The computer program product according to claim 11, wherein the control parameter is overlay and an actual optimal control parameter value is a non-zero value.

13. The computer program product according to claim 11, wherein the instructions are further configured to cause the processor system to control the process for subsequent substrates by driving the control parameter towards an optimal control parameter value.

14. The computer program product according to claim 11, wherein the values of the yield parameter have been obtained, at least in part, using voltage contrast metrology or electrical probe measurements.

15. A computer program product comprising a non-transitory computer-readable medium comprising instructions therein, the instructions, upon execution by a processor system, configured to cause the processor system to at least:
obtain a machine learning model trained to metrology data comprising measurements of an electrical characteristic from previously processed substrates and process metrology data comprising measurements of at least one parameter related to a process characteristic measured from the previously processed substrates;
obtain process metrology data related to a substrate comprising the at least one parameter;
provide the obtained process metrology data to the machine learning model for predicting an electrical characteristic of the substrate; and
dynamically update the machine learning model based on new process metrology data and/or new metrology data.

16. The computer program product according to claim 15, wherein the obtained process metrology data comprises a value and/or an uncertainty of the at least one parameter at a plurality of locations on the substrate.

17. The computer program product according to claim 15, wherein the machine learning model comprises a logistic model.

18. The computer program product according to claim 15, wherein the machine learning model is based on a method of reinforcement learning.

19. The computer program product according to claim 15, wherein the metrology data has been obtained, at least in part, using voltage contrast metrology or electrical probe measurements.

20. The computer program product according to claim 15, wherein the process metrology data comprises simulated data.

* * * * *